(12) United States Patent  
Kinzer

(10) Patent No.: US 8,525,224 B2  
(45) Date of Patent: Sep. 3, 2013

(54) III-NITRIDE POWER SEMICONDUCTOR DEVICE

(75) Inventor: Daniel M Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 1213 days.

(21) Appl. No.: 11/729,742

(22) Filed: Mar. 29, 2007

(65) Prior Publication Data

US 2008/0237632 A1 Oct. 2, 2008

(51) Int. Cl.
*H01L 31/102* (2006.01)

(52) U.S. Cl.
USPC ............... 257/189; 257/187; 257/E27.012

(58) Field of Classification Search
USPC ........ 257/187, 189, 162, 365, 368, E27.012, 257/257/E27.011, E27.029, E27.06, 730, 257/734–786, E23.004, E23.013
See application file for complete search history.

(56) References Cited

U.S. PATENT DOCUMENTS

| | | | |
|---|---|---|---|
| 2005/0189561 A1* | 9/2005 | Kinzer et al. | 257/192 |
| 2005/0189562 A1* | 9/2005 | Kinzer et al. | 257/192 |
| 2006/0289894 A1* | 12/2006 | Murata et al. | 257/192 |

* cited by examiner

*Primary Examiner* — Tucker Wright
(74) *Attorney, Agent, or Firm* — Farjami & Farjami LLP

(57) ABSTRACT

A III-nitride power semiconductor device that includes a first III-nitride power semiconductor device and a second III-nitride power semiconductor device formed in a common semiconductor die and operatively integrated to form a half-bridge.

13 Claims, 4 Drawing Sheets

III-NITRIDE POWER SEMICONDUCTOR DEVICE

DEFINITION

III-nitride (or III-N) as used herein refers to a semiconductor alloy from the InAlGaN system that includes at least nitrogen and another alloying element from group III. AlN, GaN, AlGaN, InGaN, InAlGaN, or any combination that includes nitrogen and at least one element from group III are examples of III-nitride alloys.

BACKGROUND OF THE INVENTION

The present invention relates to power semiconductor devices and more particularly to a III-nitride power semiconductor device that includes two switches integrated in a common die to form a half-bridge block.

Many power applications use half-bridge arrangements to manage the flow of current. For example, in DC-DC converters such as buck converters a half-bridge arrangement is connected between the line and ground, and is operated to control the supply of current to an output element such as an output capacitor.

In a conventional application, typically, two discreet, silicon-based vertical conduction power MOSFETs are series connected to form a half-bridge. The use of two devices consumes more board space, and because typically the devices are packaged separately, the use of two discreet devices may introduce undesirable parasitic resistance, inductance and capacitance into the circuit.

While theoretically two silicon-based power semiconductor devices may be integrated to form a half-bridge in a common semiconductor die to overcome some of the drawbacks noted above, there are practical disadvantages to doing so. For instance, it is difficult to integrate two vertical conduction type devices due to the fact that the power electrodes of silicon-based vertical conduction devices are on the opposite surfaces of the semiconductor die. Moreover, for the same current carrying capability, using lateral type devices consumes more die area than a vertical conduction device, thereby rendering such an option commercially undesirable.

SUMMARY OF THE INVENTION

In a power semiconductor device according to the present invention, two III-nitride heterojunction power switches are integrated to form a half-bridge. A III-nitride power device according to the present invention thus includes two III-nitride power semiconductor switches formed in a common III-nitride semiconductor die and connected to one another to form a half-bridge.

A III-nitride power device according to the present invention includes a first III-nitride power semiconductor switch and a second III-nitride power semiconductor switch electrically connected to one another, for example, through a common electrode, and sharing a common III-nitride active heterojunction that includes a two dimensional electron gas.

In the preferred embodiment of the present invention, the first III-nitride power semiconductor switch is a lateral conduction switch and the second III-nitride power semiconductor switch is a vertical conduction switch. The first III-nitride power semiconductor switch may be adapted to function as a control switch in a power converter, and the second III-nitride power semiconductor switch may be adapted to function as a synchronous switch in the power converter. The power converter may be a buck converter.

Other features and advantages of the present invention will become apparent from the following description of the invention which refers to the accompanying drawings.

DETAILED DESCRIPTION OF THE FIGURES

Figure 1:
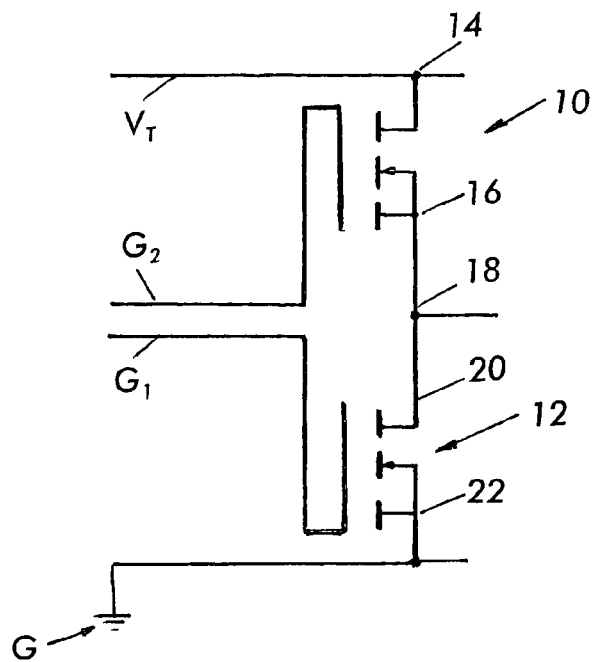
FIG. 1 illustrates a circuit diagram for a device according to the present invention.

A power semiconductor device according to the present invention is an integrated monolithic circuit which includes two power switches operatively connected to form a basic half-bridge block. Preferably, a device according to the present invention is adapted for use in a power converter, such as a DC-DC buck converter. Referring to FIG. 1 a device according to the preferred embodiment of the present invention includes a control switch 10, and synchronous switch 12 connected in a half-bridge configuration. Specifically, drain electrode 14 of control switch 10 is connectable to power input $V_+$, while source electrode 16 thereof is connected to switched node (or sometimes referred to output node) 18 of the half-bridge block. To complete the half-bridge, drain electrode 20 of synchronous switch 12 is connected to switched node 18, while source electrode 22 thereof is connectable to ground G. Control switch 10 includes a gate electrode $G_2$, and synchronous switch includes a gate electrode $G_1$ for the control of the operation thereof. Note that each of the switches may be a depletion mode or an enhancement mode III-nitride switch such as a HEMT, MISHEMT, MOSHEMT, MISHFET, MOSHFET or the like device. Further, note that for the sake of simplicity of illustration the details of the switches are omitted.

Figure 2:
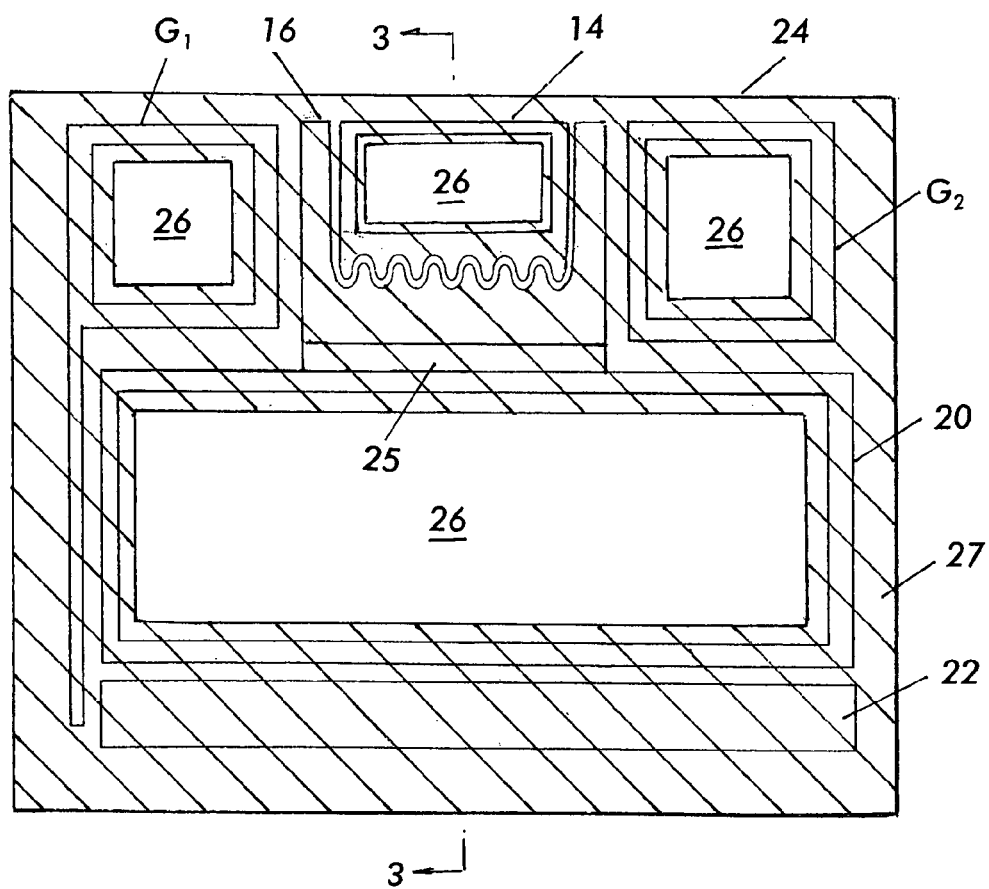
FIG. 2 illustrates a top plan view of a device according to the present invention.

Referring now to FIG. 2, a III-nitride integrated power semiconductor device according to the present invention includes a III-nitride control switch and a III-nitride synchronous switch formed in a common semiconductor die 24. The control switch is preferably a lateral conduction device which includes drain electrode 14, source electrode 16, and gate electrode $G_2$. The synchronous switch includes drain electrode 20, source electrode 22, and gate electrode $G_1$. Note that source electrode 16 and drain electrode 20 are integrated (connected to one another) through a metallic body 25.

According to one aspect of the present invention, a device according to the present invention is adapted for direct surface mounting on and electrical connection to conductive pads of a circuit board through intervening conductive adhesive bodies (e.g. conductive polymer bodies or solder bodies). Thus, drain electrode 14, drain electrode 22, gate electrode $G_1$ and gate electrode $G_2$, each includes a solderable body 26 formed thereon to allow for solder connection to a conductive pad using solder or the like conductive adhesive. Note that drain electrode 20 will serve as the switched node connection thereby obviating the need to render source electrode 16 solderable. Note that a device according to the present invention may further include an epoxy-based passivation 27 (illustrated by shaded lines and rendered transparent to illustrate the top features of the device). Passivation 27 preferably covers all the features on the top surface of the device, except that it includes openings over solderable bodies 26. Passivation body 27 may further function as a solder resist to prevent shorting when the device is mounted using solder or the like conductive adhesive.

Figure 3:
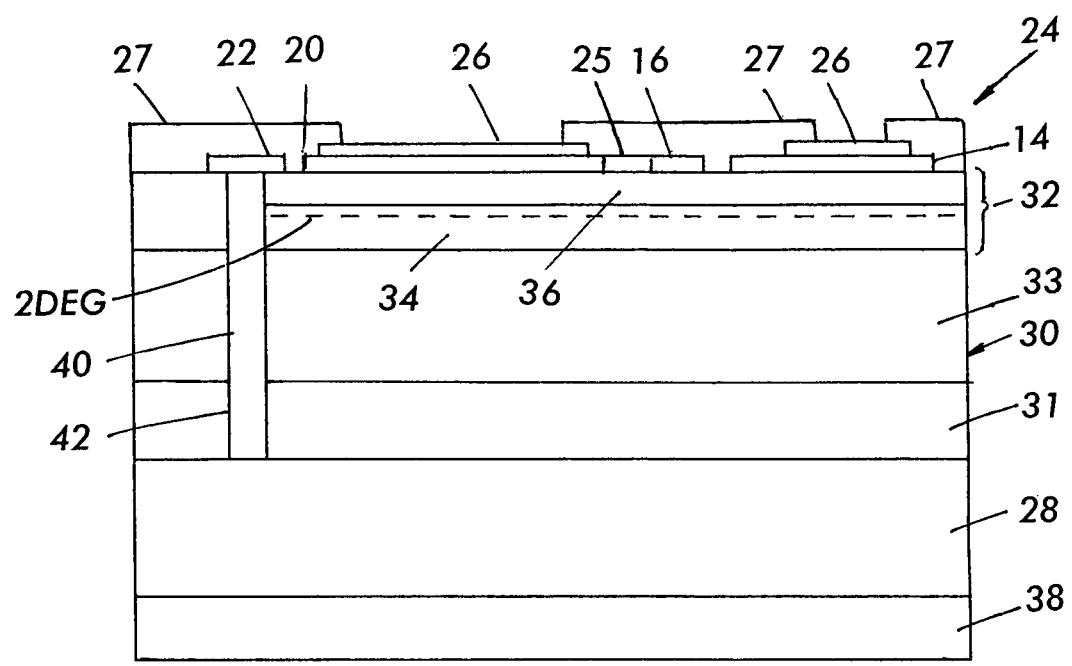
FIG. 3 illustrates a cross-sectional view of a device according to the first embodiment of the present invention taken along line 3-3 in FIG. 2 and viewed in the direction of the arrows.

Referring to FIG. 3, common semiconductor die 24 includes substrate 28, which may be comprised of Si, SiC, Sapphire, or a III-nitride material such as GaN or the like. In the preferred embodiment, substrate 28 is a monolithic silicon die. Formed on substrate 28 is a III-nitride stack 30 which may include a III-nitride transition body 31 comprised, for example, of AlN and a III-nitride buffer body 33 comprised, for example, of GaN. Note that transition body 31, when required, would be disposed between substrate 28 and buffer body 33.

Semiconductor die 24 further includes an active III-nitride heterojunction 32. Heterojunction 32 includes first III-nitride semiconductor body 34, and second III-nitride semiconductor body 36 having a band gap that is different from that of first body 34. The composition and thickness of first III-nitride body 34 and second III-nitride body 36 are selected so that a laterally oriented (generally parallel to the opposing surfaces of the semiconductor die) two dimensional electron gas (2DEG) is formed near the heterojunction of the two bodies. In the preferred embodiment, first III-nitride semiconductor body 34 is comprised of GaN while second III-nitride semiconductor body 36 is comprised of AlGaN. Thus, GaN body 34 serves as the channel body hosting the 2DEG, while AlGaN body serves as the barrier body.

Drain electrode 14, source electrode 16, drain electrode 20, and source electrode 22 are coupled to the laterally oriented 2DEG through III-nitride body 36. The laterally oriented 2DEG can be interrupted or restored (depending on the type of device) by application of an appropriate voltage to gate electrode $G_2$ whereby current between drain electrode 14 and source electrode 16 can be interrupted. Similarly, the laterally oriented 2DEG can be interrupted or restored by the application of an appropriate voltage to the gate electrode $G_1$, whereby the current between drain electrode 20 and source electrode 22 can be controlled. Thus, the operation of the control switch and the synchronous switch can be controlled through the application of a proper voltage to gate electrode $G_1$ and gate electrode $G_2$.

According to one aspect of the present invention, the synchronous switch includes a source electrode 38 formed on substrate 28. Source electrode 38 is electrically connected to source electrode 22 through a metallic body 40 which extends through a via 42 that extends from the top surface of semiconductor die 24 to at least substrate 28, which may be composed of a conductive material such as conductive silicon. In the event a non-conductive material is used, via 42 may be further extended to the back electrode 38. Metallic body 40 in via 42 is a vertical conductive path which is electrically coupled to the laterally oriented 2DEG of the synchronous switch, whereby current can be transmitted from the laterally oriented 2DEG of the synchronous switch to the source electrode 38 that is disposed on a surface opposite to the top electrodes 14, 16, 20, 22 and below the 2DEG of the synchronous switch. Thus, the synchronous switch which includes a laterally oriented 2DEG that serves as its conductive channel can become a vertical conduction device having power electrodes (namely a source electrode 38 and a drain electrode 20) on opposite faces thereof.

Figure 4A:
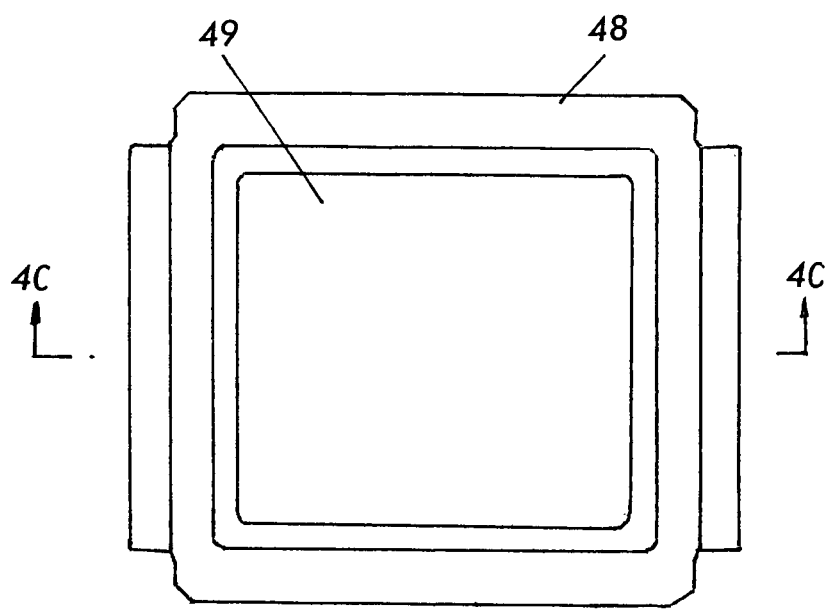
FIG. 4A illustrates a top plan view of a semiconductor package that includes a device according to the present invention.
Figure 4B:
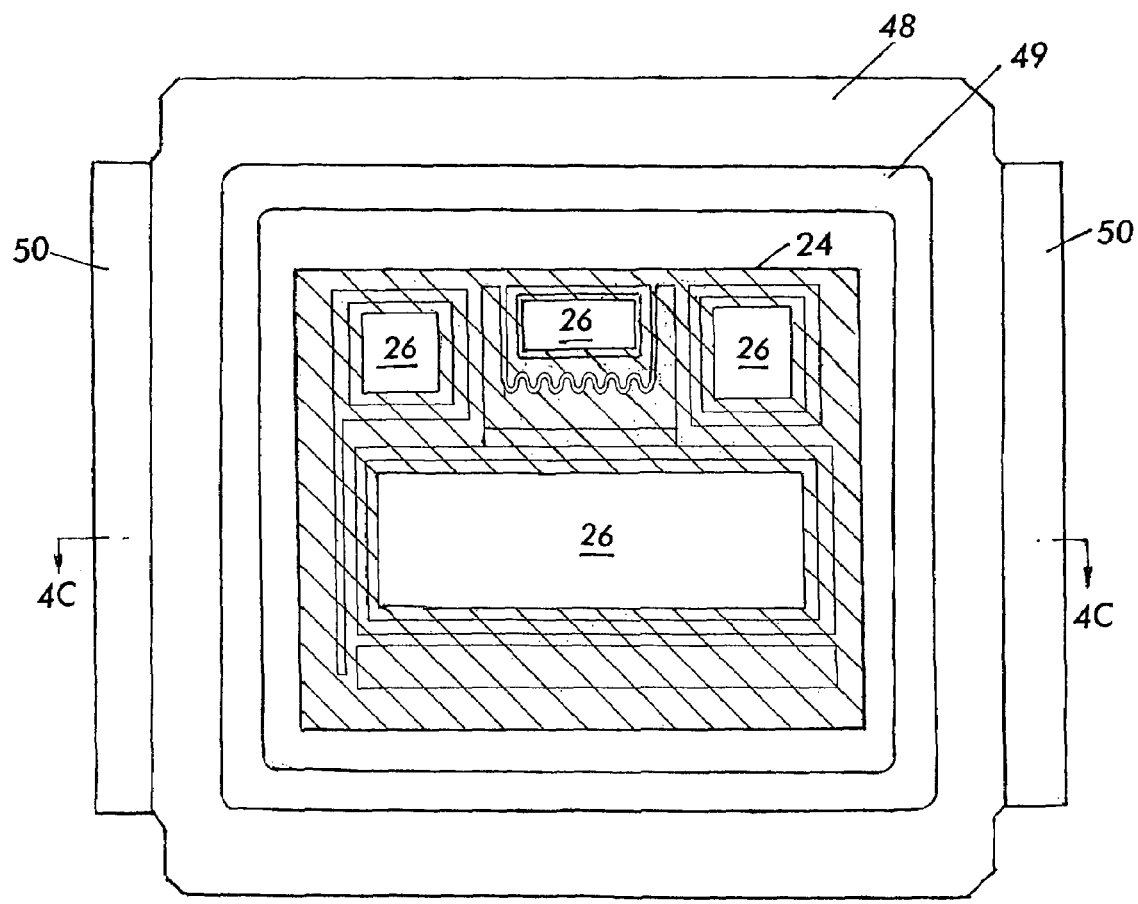
FIG. 4B illustrates a bottom plan view of a semiconductor package that includes a device according to the present invention.
Figure 4C:
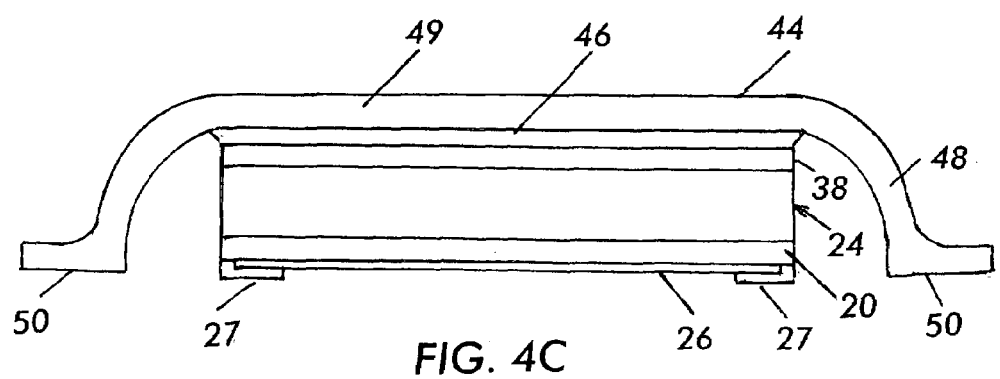
FIG. 4C illustrates a cross-sectional view of a package that includes a device according to the present invention taken along line 4-4 in FIGS. 4A and 4B and viewed in the direction of the arrows.

Referring now to FIGS. 4A-4C, back electrode 38 of a device according to the present invention may be electrically and mechanically connected to the interior surface of a conductive cup-shaped clip 44 (formed preferably with copper or a copper alloy and plated with silver or gold) through a conductive adhesive body 46 (e.g. solder body or a conductive polymer body). Clip 44 includes a rim portion 48 disposed around a flat web portion 49 which terminates at a connection surface 50 that is adapted for surface mounting onto a conductive pad using a conductive adhesive. Connection surface 50 is preferably coplanar with solderable bodies 26 of a device according to the present invention. An example of a suitable clip 44 is disclosed in U.S. Pat. No. 6,624,522, assigned to the assignee of the present invention.

Figure 5:
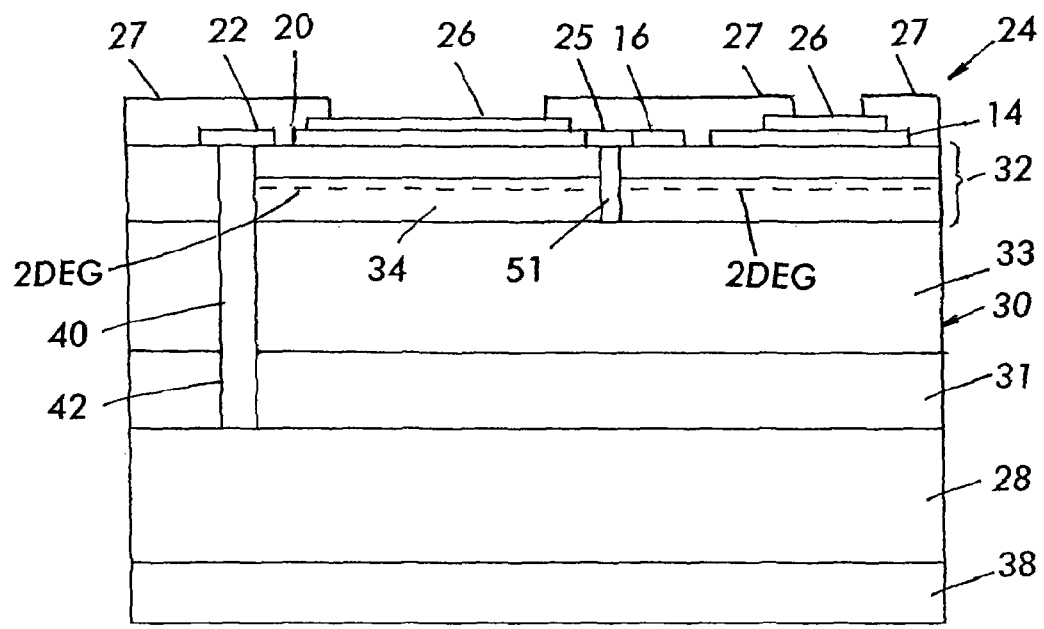
FIG. 5 illustrates a cross-sectional view of a device according to the second embodiment of the present invention.
Figure 6:
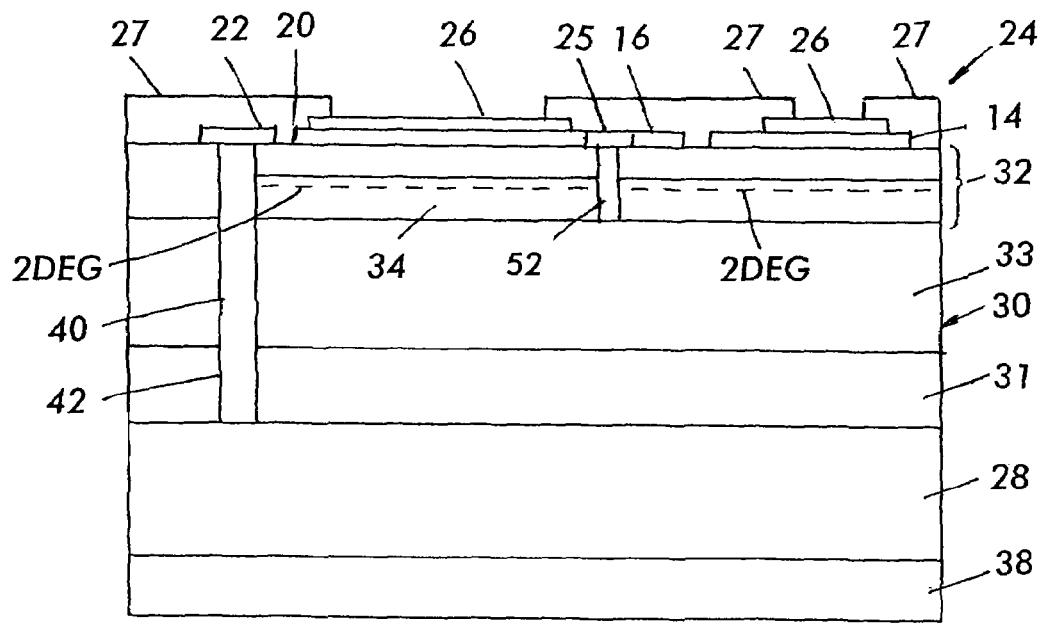
FIG. 6 illustrates a cross-sectional view of a device according to the third embodiment of the present invention.

In the preferred embodiment, the 2DEG of the control switch and the 2DEG of the synchronous switch merge. If desired, however, the 2DEG of the two switches may be isolated from one another. For example, as illustrated in FIG. 5, a trench 51 may be formed through the 2DEG region between the control switch and the synchronous switch. Trench 51 may be deep enough to reach buffer layer 30. Alternatively, a region 52 may be implanted with species (e.g. P-type atoms) that cancels the charge in the 2DEG between the control switch and the synchronous switch as illustrated by FIG. 6, whereby the control switch and the synchronous switch may be electrically isolated.

Note further that in the preferred embodiment drain electrode 14 and source electrode 16 both include fingers which are arranged in an interdigitated manner. An interdigitated arrangement is preferred because it provides for a low gate charge, and specifically low drain to gate charge (Qgd), which is desirable for a control switch in a converter circuit. On the other hand, drain electrode 20 and source electrode 22 of the synchronous switch should be arranged to lower the ON resistance (Rdson) thereof. Thus, while drain electrode 20 and source electrode 22 can be arranged in an interdigitated manner, cellular or stripe arrangements would be most preferred to achieve the lowest Rdson for the synchronous switch. Furthermore, because the control switch does not include a drain via, drain electrode 14 thereof is narrow and long. Note that source electrode 16 includes long fingers at the opposing terminal ends thereof that extend along opposing edges of drain electrode 14 to gather as much current as possible.

Preferably, gate electrode $G_2$ is positioned over the active region of the control switch, while gate electrode $G_1$ is disposed over the active region of the synchronous switch.

In an alternative embodiment, source electrode 22 of the synchronous switch may be rendered solderable (i.e. may include a solderable body 26). In such an embodiment, via 42 and back source electrode 38 may be eliminated and all connections may be made at one surface of the device.

In yet another embodiment, another conductive filled via may be provided through semiconductor die 24 (similar to via 42 and conductive filler 40) to link drain electrode 20 of the synchronous switch to a back drain electrode. In such an embodiment, the back drain electrode and source electrode 16 may have to be coupled outside of the device to provide a switched node.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor body having formed therein a lateral conduction power semiconductor device, and
   a vertical conduction power semiconductor device having a lateral conductive channel and a vertical conductive path coupled to said lateral conductive channel to transmit current from said lateral conductive channel to a conductive electrode disposed on an outer surface of said semiconductor body opposite said lateral conductive channel, wherein a first power electrode and a second power electrode of said vertical conduction power semiconductor are not interdigitated;
   said lateral conduction power semiconductor device and said vertical conduction power semiconductor device sharing a continuous two dimensional electron gas (2DEG) conduction path.

2. The semiconductor device of claim 1, wherein said lateral condition power semiconductor device is a lateral conduction heterojunction III-nitride semiconductor device, and said vertical conduction power semiconductor device is a vertical conduction III-nitride semiconductor device.

3. The power semiconductor device of claim 1, further comprising a power input electrode, and a power output electrode on one surface of said semiconductor body and a ground electrode on a second opposite surface of said semiconductor body.

4. The semiconductor device of claim 3, further comprising a control electrode for receiving control signals to control the operation of said lateral conduction device and a control electrode for receiving control signals to control the operation of said vertical conduction device on said first surface of said semiconductor body.

5. The semiconductor device of claim 3, wherein said lateral conduction device includes a control electrode and said vertical conduction device includes a control electrode, each said control electrode being disposed on one side of said power input electrode.

6. The semiconductor device of claim 1, wherein said lateral conduction device is configured to function as a control switch in a buck converter and said vertical conduction device is configured to function as a synchronous switch in said buck converter.

7. The power semiconductor device of claim 1, wherein said lateral conduction device includes a first power electrode and a second power electrode, said first power electrode serving as an input voltage electrode and said second power electrode being shorted to an output voltage electrode.

8. The semiconductor device of claim 7, wherein said power electrodes of said lateral conduction device are interdigitated.

9. The semiconductor device of claim 1, wherein said first power electrode of said vertical conduction device is disposed on one surface of said semiconductor body and said second power electrode of said vertical conduction device is disposed on another opposing surface of said semiconductor body, said first power electrode serving as a voltage output electrode and said second power electrode serving as a ground electrode.

10. A III-nitride power device comprising:
    a first III-nitride power semiconductor device and a second III-nitride power semiconductor device sharing a common III-nitride active heterojunction that includes a continuous two dimensional electron gas,
    wherein a source electrode of said first III-nitride power semiconductor device is directly connected in series to a drain electrode of said second III-nitride power semiconductor device and wherein said drain electrode and a source electrode of said second III-nitride power semiconductor device are not interdigitated.

11. The III-nitride power device of claim 10, wherein said first III-nitride power semiconductor device is a lateral conduction switch and said second III-nitride power semiconductor device is a vertical conduction switch.

12. The III-nitride power device of claim 10, wherein said first III-nitride power semiconductor device is adapted to function as a control switch in a power converter, and said second III-nitride power semiconductor device is adapted to function as a synchronous switch in said power converter.

13. The III-nitride power device of claim 12, wherein said power converter is a buck converter.

* * * * *